US012772766B2

(12) United States Patent
Evans

(10) Patent No.: US 12,772,766 B2
(45) Date of Patent: Oct. 20, 2026

(54) SUBSTRATE STRESS MANAGEMENT USING DIRECT SELECTIVE AREA PROCESSING

(71) Applicant: Applied Materials, Inc., Santa Clara, CA (US)

(72) Inventor: Morgan Evans, Manchester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 202 days.

(21) Appl. No.: 18/399,418

(22) Filed: Dec. 28, 2023

(65) Prior Publication Data

US 2025/0218788 A1 Jul. 3, 2025

(51) Int. Cl.

*H10P 50/28* (2026.01)
*G05B 19/4155* (2006.01)
*H01J 37/08* (2006.01)
*H01J 37/20* (2006.01)
*H01J 37/305* (2006.01)

(52) U.S. Cl.

CPC ........ *H10P 50/283* (2026.01); *G05B 19/4155* (2013.01); *H01J 37/20* (2013.01); *H01J 37/305* (2013.01); *G05B 2219/45212* (2013.01); *H01J 37/08* (2013.01); *H01J 2237/20228* (2013.01)

(58) Field of Classification Search

CPC ............. H01L 21/31116; H01L 21/302; G05B 19/4155; G05B 2219/45212; H01J 37/20; H01J 37/305; H01J 37/08; H01J 2237/20228

See application file for complete search history.

(56) References Cited

U.S. PATENT DOCUMENTS

| | | | | |
|---|---|---|---|---|
| 7,442,657 B2 * | 10/2008 | Mantl | B82Y 10/00 | 257/E21.054 |
| 7,521,305 B2 * | 4/2009 | Lin | H10D 30/792 | 438/786 |
| 9,842,762 B1 * | 12/2017 | Reimer | H01L 21/302 | |
| 10,723,614 B2 * | 7/2020 | Qian | B81C 1/00666 | |
| 11,201,057 B2 * | 12/2021 | Falk | H01L 21/31155 | |
| 12,381,093 B2 * | 8/2025 | Schepis | H01L 21/56 | |
| 2004/0224243 A1 * | 11/2004 | Yoshizawa | G03F 1/20 | 430/323 |
| 2006/0051938 A1 * | 3/2006 | Connell | H01L 21/78 | 438/460 |
| 2009/0057775 A1 * | 3/2009 | Shin | H10D 30/795 | 257/E21.632 |

(Continued)

FOREIGN PATENT DOCUMENTS

WO 2022119732 A1 6/2022

OTHER PUBLICATIONS

International Search Report and Written Opinion for International Application No. PCT/US2024/057432, filing date Nov. 26, 2024, 9 pages.

*Primary Examiner* — Binh X Tran
*Assistant Examiner* — Christopher Remavege
(74) *Attorney, Agent, or Firm* — KDW Firm PLLC

(57) ABSTRACT

A method may include providing a stress the substrate having a main surface, and forming a patterned stress compensation layer on the main surface, wherein the patterned stress compensation layer is formed by exposing the main surface to a processing beam while a movement of the ion beam with respect to the main surface takes place.

8 Claims, 6 Drawing Sheets

(56) References Cited

U.S. PATENT DOCUMENTS

| | | | | |
|---|---|---|---|---|
| 2014/0065730 | A1* | 3/2014 | Reece | H01J 37/304<br>118/699 |
| 2014/0256137 | A1* | 9/2014 | Richter | H10D 30/792<br>438/758 |
| 2016/0056268 | A1* | 2/2016 | Chin | H10D 30/024<br>438/283 |
| 2016/0111254 | A1 | 4/2016 | Evans | |
| 2016/0149003 | A1* | 5/2016 | Choi | H10D 30/0227<br>438/300 |
| 2018/0067403 | A1* | 3/2018 | deVilliers | H01L 22/20 |
| 2018/0122650 | A1* | 5/2018 | Ma | H01J 37/32623 |
| 2018/0197747 | A1* | 7/2018 | Waite | H01L 21/76224 |
| 2019/0177155 | A1* | 6/2019 | Qian | B81C 1/00666 |
| 2019/0185989 | A1* | 6/2019 | McFadden | C23C 14/541 |
| 2020/0118822 | A1* | 4/2020 | Falk | H01L 21/322 |
| 2022/0344171 | A1* | 10/2022 | Varghese | H01L 21/31155 |
| 2023/0326814 | A1* | 10/2023 | Schepis | H01L 21/56 |
| 2023/0369014 | A1* | 11/2023 | Subrahmanyan | H01J 37/304 |

* cited by examiner

SUBSTRATE STRESS MANAGEMENT USING DIRECT SELECTIVE AREA PROCESSING

FIELD

The present embodiments relate to stress control in substrates, and more particularly to stress compensation to manage substrate stress.

BACKGROUND

Devices such as integrated circuits, memory devices, and logic devices may be fabricated on a substrate such as a semiconductor wafer by a combination of deposition processes, etching, ion implantation, annealing, and other processes. Often, complete fabrication of devices and related circuitry may entail many hundreds of operations, including dozens of lithography operations. In particular, lithographic operations may require that a given mask to fabricate structures in a given region or level is to be aligned to preexisting structures.

A resulting problem with fabrication of substrates is the development of out-of-plane distortion (OPD) caused by stresses within the wafer, which distortion may be referred to as warpage. This OPD may be a result of stress that develops within the wafer as a result of processing. As a result, management of OPD may be critical to achieve proper overlay between structures fabricated at different levels of a device. For example, a type of OPD often encountered is a global wafer curvature that may develop at many instances of processing due to stress buildup in the wafer as a result of processing operations.

One approach to managing wafer (substrate) stress is to provide a stress compensation layer on the back of a substrate, which layer may be used counteract existing stress within the substrate and thus reduce OPD. In particular implementations, ion implantation has been used to implant ions into the stress compensation layer in order to attempt to alter the stress state in the stress compensation layer and thus indirectly change the stress and OPD in the substrate.

More recently, patterned ion implantation techniques have been contemplated where the ion dose that is directly implanted into a stress compensation layer may be varied as a function of position on a substrate. This dose variation may be accomplished by locally varying scanning speed of a scanned ion beam, for example. As a result, a varying ion dose may be implanted into different areas across a substrate to compensate for non-uniform substrate curvature, for example. However, such approaches may be relatively time consuming such that substrate throughput for substrates treated by the non-uniform ion implantation is less than ideal.

With respect to these and other considerations the present embodiments are provided.

BRIEF SUMMARY

In one embodiment, a method is provided. The method may include providing a stress the substrate having a main surface, and forming a patterned stress compensation layer on the main surface, wherein the patterned stress compensation layer is formed by exposing the main surface to a processing beam while a movement of the ion beam with respect to the main surface takes place.

In another embodiment, a process system is provided. The processing system may include a plasma to generate a processing beam, and a substrate stage to scan a substrate along a first direction, wherein a main surface of the substrate is arranged to intercept the processing beam. The processing system may include a controller that includes e a processor; and a memory unit coupled to the processor, including a selective area stress management routine, the selective area stress management routine operative on the processor to control the ion implanter to form a patterned stress compensation layer on the first main surface. As such, the ion implanter may be controlled to form the patterned stress compensation layer by exposing the main surface to the processing beam while a movement of the processing beam with respect to the main surface takes place.

In a further embodiment, a controller for a processing system is provided. The controller may include a processor; and a memory unit coupled to the processor, the memory unit including a including a selective area stress management routine. The selective area stress management routine may be operative on the processor to control the ion implanter to receive a surface map of a main surface of the substrate. The selective area stress management routine may be further operable to control the processing system to form a patterned stress compensation layer according to the surface map, wherein the patterned stress compensation layer is formed by exposing the main surface to a processing beam while a movement of the processing beam with respect to the main surface takes place.

DETAILED DESCRIPTION

Figure 1B:
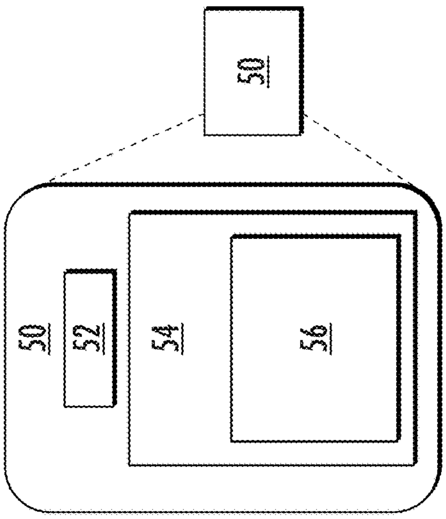
FIG. 1B shows further details of a controller according to some embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein relate to techniques and apparatus for improved substrate stress management. The present embodiments present an approach that employs a novel approach to selectively form a patterned stress compensation layer to reduce stress and OPD in a substrate. As detailed herein an ion beam may be directed to a substrate in a processing system, where the scanning of the substrate or ion beam takes place to mutually scan the substrate with respect to the ion beam. The processing system parameters may be set to generate a selective area processing or non-uniform processing of the substrate is performed to form a patterned stress compensation layer on the substrate surface. In particular, as detailed herein below, a selective area processing of a substrate may be carried out by one of a plurality of selective processing approaches that employ reactive species, including a reactive ion beam or reactive radical flux to reactively etch or reactively deposit a stress compensation layer. Such selective processing may also be referred to herein as "selective area processing" and in particular implementations, as "selective area etching" or alternatively as "selective area deposition" or "selective area damaging"

Figure 1C:
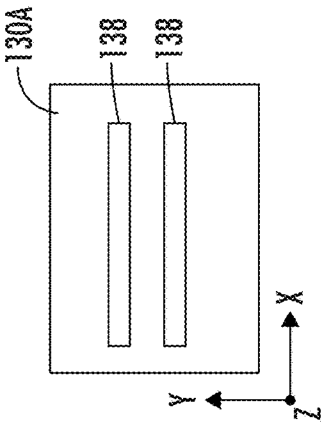
FIG. 1C depicts an embodiment of an extraction plate for providing a plurality of processing beams.
Figure 1A:
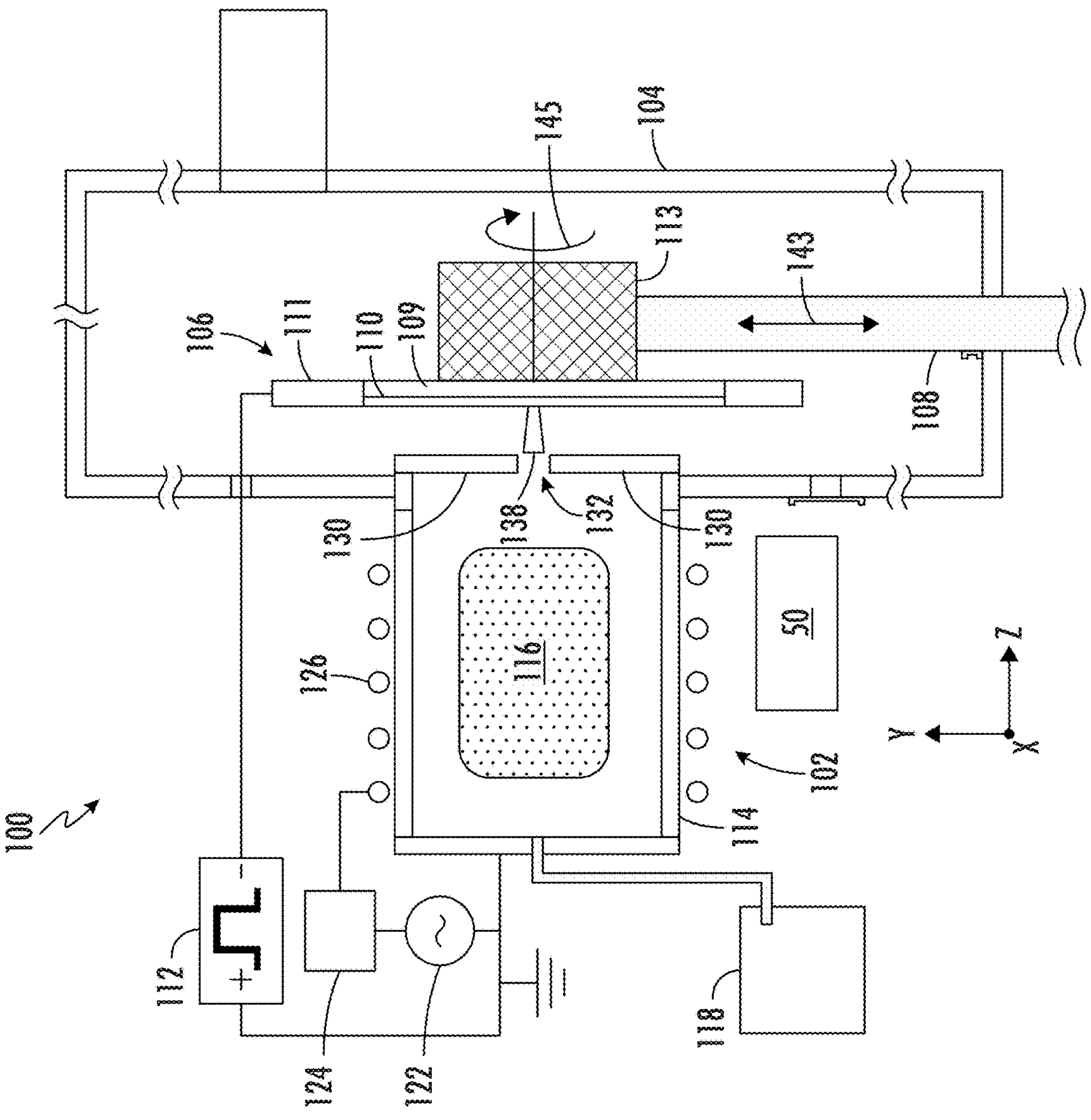
FIG. 1A shows an exemplary system in accordance with the present disclosure.

Referring to FIG. 1A there is shown a schematic cross-sectional view and a perspective, cut-away view illustrating an interior of a processing system (hereinafter "the system 100") consistent with embodiments of the present disclosure. The system 100 may generally include an ion source 102 connected to a process chamber 104. The process chamber 104 may contain a platen assembly 106 mounted on a movable shaft 108 for supporting and scanning a substrate such as a semiconductor substrate (hereinafter "the substrate 110") in front of the ion source 102. The platen assembly 106 may include a platen 109 supporting a rear surface of the substrate 110, a halo 111 radially surrounding the platen 109 and the substrate 110, and a base 113 coupling the platen 109 to the movable shaft 108, for example. The present disclosure is not limited in this regard. The processing system 100 may further include a pulsed voltage supply 112 electrically coupled to a plasma chamber 114 of the ion source 102 and to the substrate 110 (or to the platen assembly 106) for generating a bias voltage therebetween. As such, the system 100 may act as an ion beam processing system to generate ion beams for processing the substrate 110 (e.g., to perform etching and deposition processes on the substrate 110) as further described below.

The ion source 102 of the system 100 may be configured with a plasma chamber, to generate a plasma 116 from a mixture of gaseous species supplied to the plasma chamber 114 by a gas manifold 118. For example, the plasma chamber 114 may be referenced to ground potential, and the ion source 102 may include a radio frequency (RF) generator 122 and a RF matching network 124 coupled to a RF antenna 126 surrounding the plasma chamber 114 for igniting the gaseous species and sustaining the plasma 116 in a manner familiar to those of ordinary skill in the art. The present disclosure is not limited in this regard.

The ion source 102 may include an extraction plate 130 enclosing an end of the plasma chamber 114 proximate the platen assembly 106. The extraction plate 130 may define an extraction aperture 132 elongated in a direction parallel to the X-axis of the illustrated Cartesian coordinate system in FIG. 1A. The extraction aperture 132 may allow ions from the plasma chamber 114 to pass through to the substrate 110 as further described below. The ion source 102 may optionally include a beam blocker (not shown) that is mounted to the extraction plate 130 adjacent the extraction aperture 132, as in known apparatus. When a negative voltage is applied to the substrate 110 (or to the platen assembly 106) with respect to the plasma chamber 114 in the presence of the plasma 116, an ion beam 138 is extracted through the extraction aperture 132.

During processing of the substrate 110, the ion source 102 may be operated to project the ion beam 138 onto the front surface of the substrate 110 while the movable shaft 108 is translated up and down (as indicated by arrow 143) to scan the substrate 110 in front of the ion source 102 along the Y-axis, for example. The substrate 110 may also be rotated by rotating the platen 109 about a central axis (parallel to the Z-axis in the Cartesian coordinate system shown, as indicated by arrow 145). Thus, desired portions of the substrate 110 may be exposed to the ion beam 138 in a controlled manner to achieve highly targeted processing. In various processes, the gaseous species supplied to the plasma chamber 114 may be selected to generate reactive ions and etching radicals to perform ion assisted etching of the substrate 110. Such gaseous species may include, and are not limited to, fluorocarbon monomers (e.g., $CF_4$, $C_2F_6$, $C_3F_8$). In other processes the gaseous species supplied to the plasma chamber 114 may be selected to produce polymeric species to effectuate ion beam deposition on the substrate 110. Such gaseous species may include, and are not limited to, hydrogen ($H_2$), methane ($CH_4$), and/or hydrogenated fluorocarbons ($C_2F_8$, $C_4F_8$, $CH_3F$, $CHF_3$). These gaseous mixtures may be diluted with other gases such as $N_2$, $O_2$, or Ar. The etching and polymerization gaseous species may be supplied to the plasma chamber 114 simultaneously or they may be repeatedly alternated to perform etching and deposition processes on the substrate 110 in a cyclical manner. The present disclosure is not limited in this regard.

When an etching process is performed on the substrate 110, ions contained in the ion beam 138 may bombard the substrate 110 and may generate dangling bonds at the surface of the substrate 110. Then etching radicals coming from the ion source 102 through the extraction aperture 132 may interact with the bombarded surface to form volatile byproducts. Thus, a chemical etching process is a conjugated interaction of the ion beam 138 and etching radicals with the surface of the substrate 110. Simultaneously, some polymeric species may deposit on certain portions of the substrate 110, thus protecting such portions from ion bombardment. In this fashion a strongly anisotropic etching process can take place. Note that according to different embodiments, the composition of the gaseous species may be tailored such that an ion beam 138 or other ion beam causes a net deposition of material on the substrate 110, or a net etching of material on the substrate 110. Thus, while the substrate 110 is scanned along the Y-axis, and or rotated about the Z-axis (or additionally tilted about the X-axis), an ion beam may effectively be scanned over any portion or all of the substrate 110. By controlling various processing system parameters, the ion beam 138 may generate a patterned stress compensation layer on the surface of substrate 110, as discussed below.

While the above embodiment depicts the plasma chamber 114 operating as an ion source, in other embodiments, a plasma chamber 114 or similar chamber may operate as a radical source to generate radical species that are chemically reactive and are not necessarily ionized, thus being of neutral charge. Radicals may include excited atoms or excited molecules where electrons contained therein are in an excited state, while the atom or molecule is not ionized.

Such radical species may be extracted from an extraction aperture 132 to form a source of radical flux, or radical beam that is used to process the substrate 110 in a manner similar to the ion beam 138.

While the example of system 100 may be employed to generate a reactive ion beam, in further embodiments, the system 100 may employ an inert or non-reactive plasma that generates the ion beam 138 as an inert ion beam, such as a noble gas based ion beam. Generally, the system 100 or other processing system may provide processing species such as a processing beam at energies ranging from 100 eV or so up to 10 keV or so depending upon the exact selective area process to be performed, as detailed below. Moreover, instead of one aperture, the system 100 may include a plurality of extraction apertures 132 that are arranged along an extraction plate 130 as shown in FIG. 1C. Thus, a plurality of processing beams may be extracted to process a substrate using a configuration such as in FIG. 1C. In the embodiments to follow, selective area processing that involves selective area deposition or selective area etching may be performed at energies of several keV or lower, while processes involving a selective area damage operation may be performed at energies up to 10 eV or more.

Figure 2D:
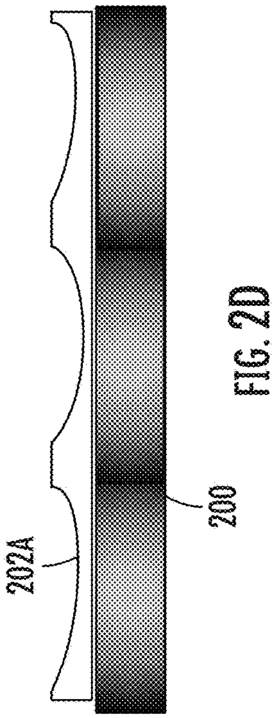
FIG. 2A to FIG. 2E depict exemplary stages in processing a substrate to reduce OPD according to some embodiments of the disclosure.
Figure 2E:
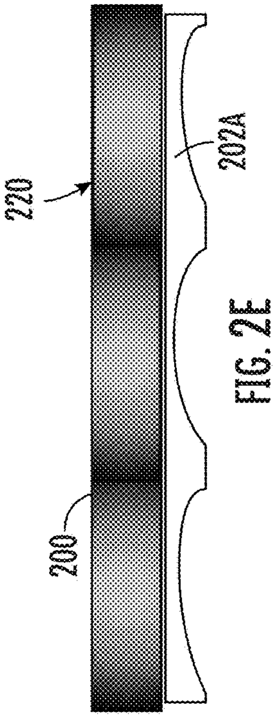
Figure 2F:
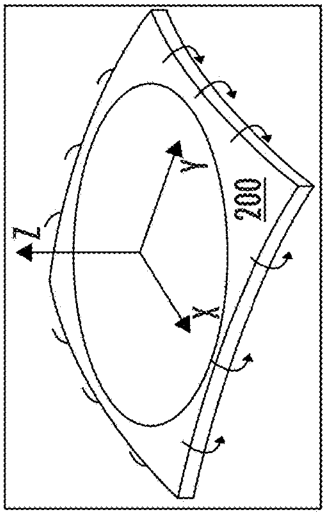
FIG. 2F presents a portion of an exemplary three dimensional view of a substrate surface.
Figure 2A:
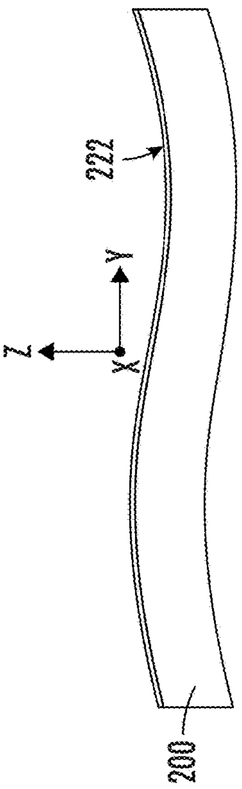

To explain some principles involved is selective processing to form a patterned stress compensation layer that reduces substrate OPD, FIG. 2A to FIG. 2E depict exemplary stages in processing a substrate according to some embodiments of the disclosure. FIG. 2F presents a portion of an exemplary three dimensional perspective view of a substrate surface. In FIG. 2F, the substrate surface of substrate 200 is not flat, meaning the surface does not lie in the X-Y plane. Rather an OPD pattern is seen where the substrate surface may extend above an X-Y plane in both X- and Y-directions, and may have any arbitrary pattern of OPD. In the views of FIG. 2A to FIG. 2E, just a cross-sectional view of the substrate 200 is shown At FIG. 2A there is shown a substrate 200, which substrate may be a silicon wafer. The substrate 200 may exhibit a curvature, including an OPD characterized by a complex pattern of warpage in some embodiments. In the example shown, the substrate is shown in cross-section, such as within an Y-Z plane of the Cartesian coordinate system shown, but the relative dimensions in terms of width and substrate thickness and curvature may not be drawn to scale. For example, the substrate 200 may represent a wafer having a diameter along the main surface of 200 mm, 300 mm, or other size according to some non-limiting embodiments. The thickness of the substrate 200 may be on the order of several hundred micrometers in some embodiments. Moreover, the maximum OPD exhibited by the substrate 200, which OPD may be expressed in terms of deviation from a nominally flat X-Y plane, may be on the order of a few hundreds of micrometers.

Figure 2B:
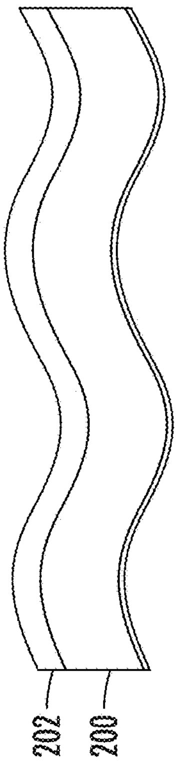

At FIG. 2B, a subsequent instance is shown where a stress compensation layer 202 has been formed on a main surface of the substrate 200. Unless otherwise noted, the term "main surface" or "first main surface" or similar terms, as used herein may refer to either main surface of a substrate such as a wafer, such as a back side of a wafer where devices or circuits may be absent, or a front side of a wafer, where devices, circuitry, and the like are to be formed or are already present. The stress compensation layer 202 may be a known stress compensation layer material, such as an oxide layer or a nitride layer according to some non-limiting embodiments, including silicon nitride (hereinafter referred to also as "SiN"). As such, the stress compensation layer 202 may or may not alter the overall stress state of the substrate 200 substantially, and thus the pattern of OPD exhibited in FIG. 2A may persist, as suggested in FIG. 2B. In some embodiments, a stress compensation layer 202 may be deposited to exhibit a relatively substantial stress state. By forming the stress compensation layer 202 in a relatively high stress state, selective area processing to locally destress the stress compensation layer 202 may have a relatively greater impact on controlling the stress in the substrate 200. Such selective area processing is detailed in the embodiments to follow.

While the instance in FIG. 2B may illustrate formation of a dedicated stress compensation layer, in other embodiments, a pre-existing layer on the substrate 200 may act as the stress compensation layer 202, such as a hard mask layer or other layer. Moreover, the stress compensation layer 202 may be provided on a back side of the substrate 200, opposite to a front side where devices are formed, or in some examples may be located on the front side of substrate 200, such as the case of an existing hard mask layer.

Figure 2C:
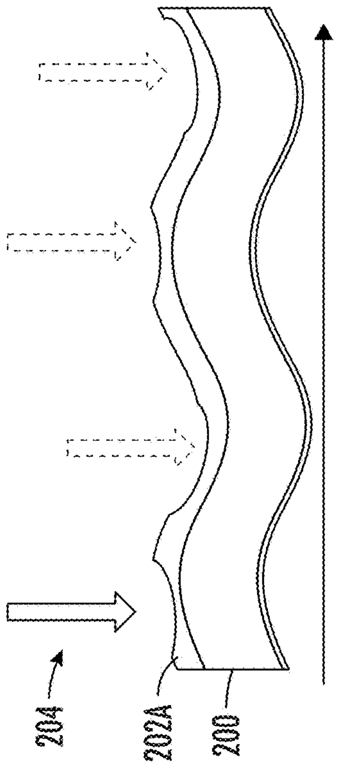

At FIG. 2C, a subsequent instance is shown where a scanned processing beam, shown as processing beam 204, is used to form a patterned stress compensation layer 202A. The processing beam 204 in this embodiment and other embodiments may be a reactive ion beam, an inert ion beam, or a radical beam. In this example, the substrate 200 may be scanned with respect to the processing beam 204, which beam may remain stationary, as in the system 100. However, in other embodiments, scanning of the processing beam 204 may take place with respect to a stationary state of substrate 200, or scanning of both processing beam 204 and substrate 200 may take place simultaneously. In all these embodiments, the processing beam 204 may be translated with respect to the substrate 200. Moreover, as used herein, a "scanned beam" "scanned processing beam" or "scanned ion beam" may refer to any of the above scenarios, including a scenario where the processing beam is stationary and the substrate is scanned with respect to the processing beam.

In the scenario of FIG. 2C, the patterned stress compensation layer 202A is being formed in a manner where regions of the stress compensation layer 202 are reduced in thickness with respect to other regions. Thus, net etching of these regions takes place with respect to other regions. In some examples, regions of stress compensation layer 202 may be completely removed, exposing the substrate 200. In other words, the stress compensation layer 202 may be formed with variable thickness across the X-Y plane, where variable thickness of the stress compensation layer may also denote a circumstance where at certain location(s) in the X-Y plane the stress compensation layer has zero thickness. Moreover, in some embodiments, as suggested by FIG. 2C, the variable thickness of a stress compensation layer may be characterized by a thickness profile where the thickness varies as a function of position according to a targeted profile, in order to manage substrate stress and OPD.

In order to generate the patterned stress compensation layer 202A, where certain regions are selectively etched with respect to other regions, the scan rate of substrate 200 may be selectively changed during as a function of position of the processing beam 204. For example, at the locations indicated by the vertical arrows, the scan rate may be slowed so that the processing beam 204 spends relatively more time at those locations, causing relatively more etching. In other embodiments, such as embodiments using a pulsed ion beam, the duty cycle of the processing beam 204 may be varied according to location during scanning of the substrate along the Y-axis, such that the effective ion dose provided by processing beam 204 is varied. In some embodiments, both scan rate of a substrate 200 and duty cycle of processing beam 204 may be varied during the scanning of substrate 200.

Figure 3:
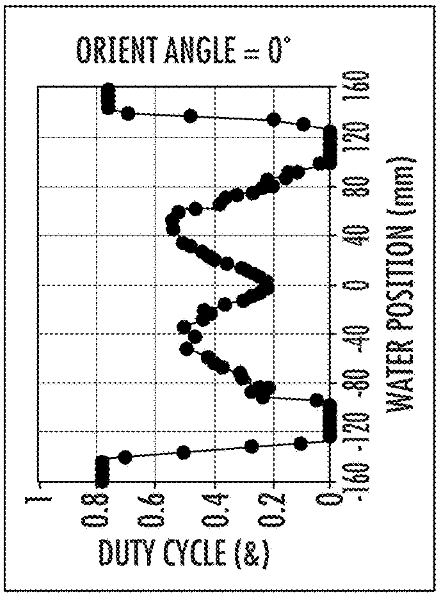
FIG. 3 is a graph that presents duty cycle of a pulsed ion beam as a function of wafer position.

FIG. 3 presents one example of a recipe for duty cycle pulsing of a processing beam, such as an ion beam, shown as a function of position on a wafer. Thus, at different positions on a wafer, as a wafer is scanned with respect to an ion beam or an ion beam is scanned with respect to a wafer, the duty cycle of pulsed ion beam is varied, so that relatively more ion exposure occurs at certain locations (higher duty cycle), and relatively less ion exposure occurs at other locations (relatively lower duty cycle). While, the graph of FIG. 3 presents duty cycle as a function of position along a given axis, in various embodiments, an ion beam may be scanned along a given direction, such as a Y-direction with respect to a substrate for a first exposure, and then the substrate may be rotated about the Z-axis, while the ion beam is scanned again in a second exposure along the same original Y-direction. In each of these exposures, the duty cycle may be varied, as generally depicted in FIG. 3, so as to generate a 2-dimensional pattern of non-uniform etching in a stress compensation layer 202.

In additional embodiments of the disclosure, while a substrate is scanned with respect to a stationary processing beam, such as a ribbon ion beam or ribbon radical beam, the scan speed of the substrate may be selectively varied as a function of location over the substrate, so as to impart a varying degree of exposure to the processing beam, and thus a varying degree of etching of the stress compensation layer 202. In any of these embodiments, where an ion beam duty cycle is varied in the case of an ion beam, substrate scan speed is varied (in the case of ion beams or radical beams), processing beam scan speed is varied (in the case of ion beams or radical beams), or a combination thereof, the resulting structure of stress compensation layer 202 may be as depicted in FIG. 2C.

Turning to FIG. 2D, there is shown the scenario after completion of the processing in FIG. 2C. Because the patterned stress compensation layer 202A has been selectively patterned, with varying thickness at different locations on substrate 200, the forces exerted by the patterned stress compensation layer 202A on substrate 200 will vary at different locations along the X-Y plane. For example, in embodiments where the stress compensation layer 202 exhibits a high degree of tensile stress, by forming targeted regions where the stress compensation layer 202 is thinner or absent, less tensile stress will be imparted into the substrate 200 in those targeted regions. As such, by proper selection of the pattern for patterned stress compensation layer 202A, the warpage and OPD exhibited by substrate 200 at FIG. 2A may be reduced or eliminated, as suggested in FIG. 2D. Subsequently, in some embodiments, the substrate 200 may be flipped (See FIG. 2E) for further processing of main surface 220, which surface is opposite the main surface 222 that supports patterned stress compensation layer 202A. For example, according to various embodiments, the stress compensation layer 202 may be formed on a back side of a substrate 200, where the front side (main surface 222) is used for device formation. At this stage of processing, because the substrate 200 is relatively flat, IPD, alignment, overlay, or other related issues may be reduced during further processing of substrate 200.

While the above embodiments of FIGS. 2A-2E have focused upon selective area etching of stress compensation layers to reduce OPD, in other embodiments, a selective area deposition may be performed to accomplish similar reduction in OPD. FIG. 4A to FIG. 4D depict exemplary stages in processing a substrate to reduce OPD according to further embodiments of the disclosure. IN FIG. 4A-4D, like FIG. 2A, the substrate 400 is shown in side cross-section within the Y-Z plane. At the stage of processing in FIG. 4A, the substrate 400, such as the main surface 402, may exhibit a curvature, including an OPD characterized by a complex pattern of warpage in some embodiments.

Figure 4A:
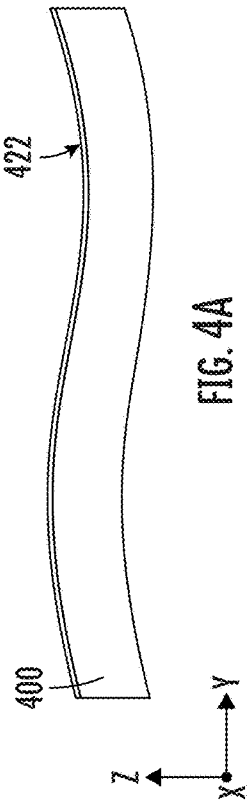
FIG. 4A to FIG. 4D depict exemplary stages in processing a substrate to reduce OPD according to other embodiments of the disclosure.
Figure 4B:
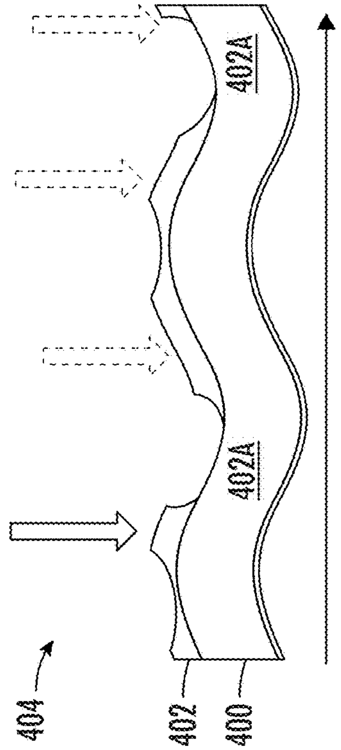

Turning to FIG. 4B, there is shown a subsequent instance where a selective area deposition is performed, using a processing beam 404, where the processing beam may be a reactive ion beam, inert ion beam, radical beam, according to different embodiments. In the scenario of FIG. 4B, a stress compensation layer 402 is being formed directly as a patterned stress compensation layer in a manner where regions of the stress compensation layer 402 exhibit a lesser thickness with respect to other regions. Thus, a net deposition in these regions is less with respect to other regions. In some examples, the stress compensation layer 402 may be completely absent, exposing the substrate 400, as shown in locations 402A. In order to generate the patterned stress compensation layer 202A, where certain regions are selectively thinner with respect to other regions, the scan rate of substrate 400 may be selectively changed during as a function of position of the processing beam 404. For example, at the locations indicated by the vertical arrows, the scan rate may be increased so that the processing beam 404 spends relatively less time at those locations, causing relatively more etching. In other embodiments, such as embodiments using a pulsed ion beam, the duty cycle of the processing beam 404 may be varied according to location during scanning of the substrate along the Y-axis, such that the effective ion dose provided by processing beam 204 is varied. For example, the duty cycle of the processing beam 404 may be reduced at the regions indicated by the vertical arrows, leading to less deposition time for processing beam 404 in those regions. In some embodiments, both scan rate of a substrate 400 and duty cycle of processing beam 404 may be varied during the scanning of substrate 400.

Figure 4C:
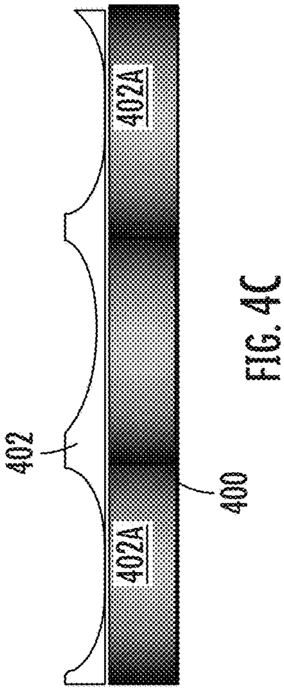
Figure 4D:
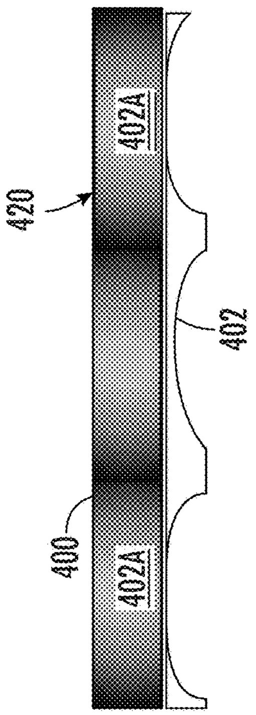

Turning to FIG. 4C, there is shown the scenario after completion of the processing in FIG. 4B. Because the patterned stress compensation layer 402 has been selectively deposited, with varying thickness at different locations on substrate 400, the forces exerted by the stress compensation layer 402 on substrate 400 will vary at different locations along the X-Y plane. As such, by proper selection of the pattern for stress compensation layer 402, the warpage and OPD exhibited by substrate 400 at FIG. 4A may be reduced or eliminated, as suggested in FIG. 4C. Subsequently, in some embodiments, the substrate 400 may be flipped (see FIG. 4D) for further processing of main surface 420, which surface is opposite the main surface 422 that supports stress compensation layer 402. For example, according to various embodiments, the stress compensation layer 402 may be formed on back side of a substrate 400, where the front side (main surface 422) is used for device formation. At this stage of processing, because the substrate 400 is relatively flat, IPD, alignment, overlay, or other related issues may be reduced during further processing of substrate 400.

FIG. 5A to FIG. 5E depict exemplary stages in processing a substrate according to some embodiments of the disclosure. At FIG. 5A there is shown a substrate 500, which substrate may be a silicon wafer. The substrate 500 may exhibit a curvature, including an OPD characterized by a complex pattern of warpage in some embodiments. In the example shown, the substrate is shown in cross-section, such as within an Y-Z plane of the Cartesian coordinate system shown, but the relative dimensions in terms of width and substrate thickness and curvature may not be drawn to scale. For example, the substrate 500 may represent a wafer having a diameter along the main surface of 200 mm, 300 mm, or other size according to some non-limiting embodiments. The thickness of the substrate 500 may be on the order of several hundred micrometers in some embodiments. Moreover, the maximum OPD exhibited by the substrate 500, which OPD may be expressed in terms of deviation from a nominally flat X-Y plane, may be on the order of a few hundreds of micrometers.

Figure 5A:
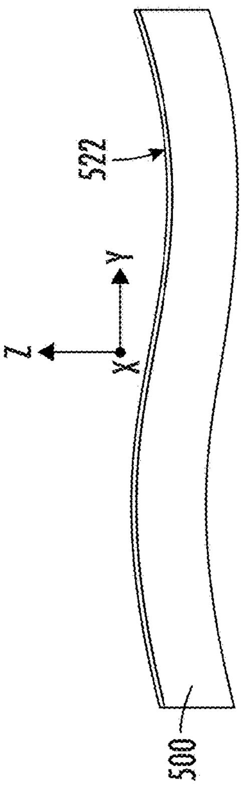
FIG. 5A to FIG. 5E depict exemplary stages in processing a substrate to reduce OPD according to some embodiments of the disclosure.
Figure 5B:
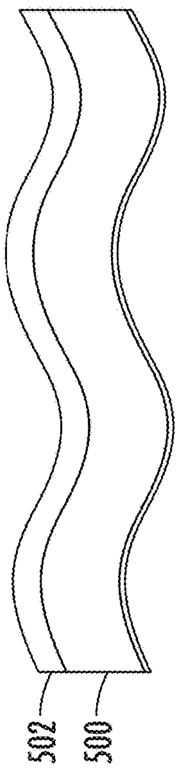

At FIG. 5B, a subsequent instance is shown where a stress compensation layer 502 has been formed on a main surface of the substrate 500, where the stress compensation layer 502 may be similar to the stress compensation layer 202, described above.

Figure 5C:
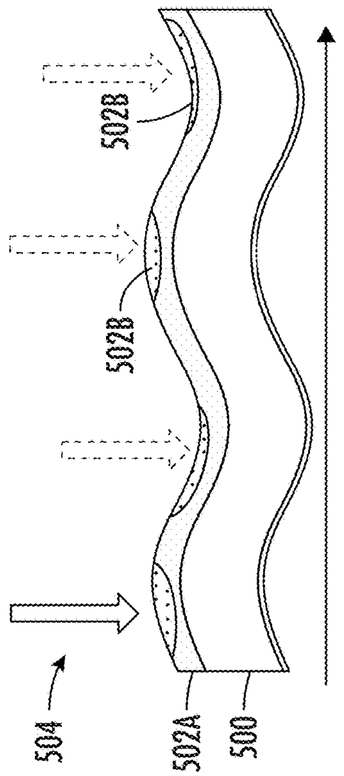

At FIG. 5C, a subsequent instance is shown where a scanned processing beam, shown as processing beam 504, is used to form a patterned stress compensation layer 502A. The processing beam 504 in this embodiment and other embodiments may be a reactive ion beam, an inert ion beam, or a radical beam. Generally, the processing beam 504 will include processing species having sufficient mass and sufficient kinetic energy, such as greater than ~100 eV, to create substantial damage within the patterned stress compensation layer 502A. In this example, the substrate 500 may be scanned with respect to the processing beam 504, which beam may remain stationary, as in the system 100. However, in other embodiments, scanning of the processing beam 504 may take place with respect to a stationary state of substrate 500, or scanning of both processing beam 504 and substrate 500 may take place simultaneously.

In the scenario of FIG. 5C, the patterned stress compensation layer 502A is being formed in a manner where regions of the stress compensation layer 502 are damaged with respect to other regions. For the purposes of illustration FIG. 5C illustrates a plurality of damaged regions 502B, which regions may receive more extensive processing by an energetic beam as opposed to other regions of the stress compensation layer 502. As such, the regions 502B may exhibit a greater degree of ion implantation, displacement of existing atoms, amorphization, or other damage. This damage may result in a relatively lesser stress in the damaged regions 502B, as opposed to other regions in the stress compensation layer 502. However, it may be understood that other regions of stress compensation layer may receive some damage, albeit less so that the damaged regions 502B. More generally, the process of FIG. 5C may be referred to as "selective area damaging" or "selective area damage" operation that selectively imparts damage into the stress compensation layer at different locations across the substrate 500. Without being bound by a particular theory, this damage may include changing the stoichiometry of the stress compensation layer 502, displacing the atoms from their crystalline location, or both. This damage process may also result in amorphization, or decreasing crystalline order within the stress compensation layer 502. As a result this damage process is known to locally de-stress the stress compensation layer 502 according to a desired pattern across the substrate 500.

In order to generate the patterned stress compensation layer 502A, where certain regions are selectively damaged with respect to other regions, the scan rate of substrate 500 may be selectively changed during as a function of position of the processing beam 504. For example, at the locations indicated by the vertical arrows, the scan rate may be slowed so that the processing beam 504 spends relatively more time at those locations, causing relatively more local damage. In other embodiments, such as embodiments using a pulsed ion beam, the duty cycle of the processing beam 504 may be varied according to location during scanning of the substrate along the Y-axis, such that the effective ion dose provided by processing beam 504 is varied. In some embodiments, both scan rate of a substrate 500 and duty cycle of processing beam 504 may be varied during the scanning of substrate 500.

Figure 5D:
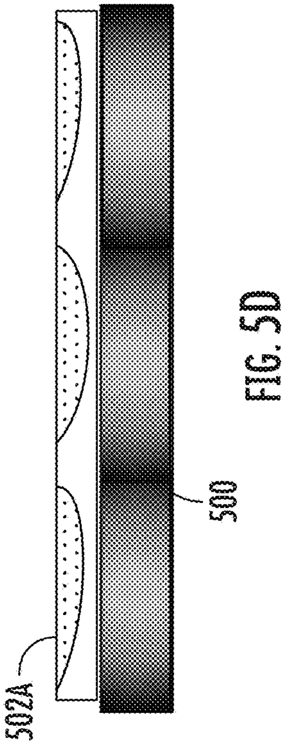
Figure 5E:
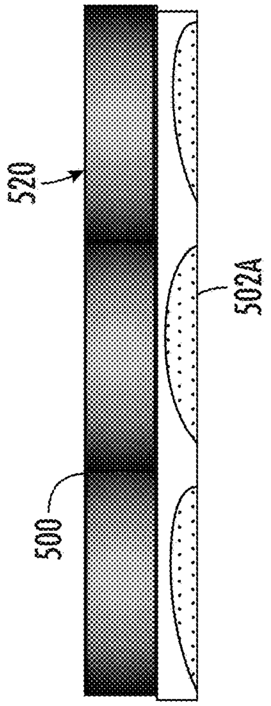

Turning to FIG. 5D, there is shown the scenario after completion of the processing in FIG. 5C. Because the patterned stress compensation layer 502A has been selectively patterned, with varying damage, and therefore varying local stress, at different locations on substrate 500, the forces exerted by the patterned stress compensation layer 502A on substrate 500 will vary at different locations along the X-Y plane. As such, by proper selection of the damage pattern for patterned stress compensation layer 502A, the warpage and OPD exhibited by substrate 500 at FIG. 5A may be reduced or eliminated, as suggested in FIG. 5D. Subsequently, in some embodiments, the substrate 500 may be flipped (See FIG. 5E) for further processing of main surface 520, which surface is opposite the main surface 522 that supports patterned stress compensation layer 502A. For example, according to various embodiments, the stress compensation layer 502 may be formed on back side of a substrate 500, where the front side (main surface 522) is used for device formation. At this stage of processing, because the substrate 500 is relatively flat, IPD, alignment, overlay, or other related issues may be reduced during further processing of substrate 500.

Experimental Results of Selective Area Processing

To demonstrate the control that is achievable by selective area processing of substrates using the above principles as highlighted in FIGS. 2A to 5E, experiments were conducted to perform selective area etching of a variety of substrate layers. In one example, a FCVD (Flowable chemical vapor deposited) oxide layer was disposed on an outer surface of a silicon wafer, having an initial average thickness of the FVCD oxide is 1797 Å where the thickness varied in a symmetrical annular fashion. The thickness range, corresponding to a difference between maximum and minimum thickness, was 140 Å. After a selective area etching process was performed that employs scanning of an ion beam with respect to the substrate, in accordance with the principles outlined above, in order to non-uniformly etch the substrate to reduce the thickness variation. Thus, areas of greater thickness received a relatively greater amount of etching than areas of less layer thickness. As such, the average thickness after selective area etching was 1621 Å, meaning an average of 176 Å of oxide layer has been removed across the substrate. However, because this average thickness was removed in a non-uniform manner, the resulting range after etching has been reduced to just 12 Å from the initial 150 Å.

Similar results were achieved using selective area etching of tungsten layers. In one example, the initial average thickness of the tungsten was 1350 Å where the thickness varied in a somewhat annular fashion as a function of position on the wafer. The initial thickness range was 150 Å. After selective area etching, the average thickness after selective area etching is 1087 Å, meaning an average of 263 Å of tungsten layer was removed across the substrate. However, because this average thickness was removed in a non-uniform manner, the resulting thickness range after etching was reduced to just 9 Å from the initial 140 Å.

In another experiment, an oxide layer was provided on a silicon substrate having an initial average thickness of 2004 Å where an isolated mesa was observed to extend above a generally flat substrate surface. The initial thickness range was 120 Å. After selective area etching, the average thickness was 1886 Å, meaning an average of 116 Å of oxide layer was removed across the substrate. However, because this average thickness was removed in a non-uniform manner, the resulting range after etching was reduced to just 25 Å from the initial 120 Å.

In each of the examples of etching tungsten, FCVD oxide, or oxide, a selective area etching approach that employs a reactive ion ribbon beam was used to reduce overall thickness non-uniformity, demonstrating the ability to tailor a thickness profile across a substrate down to the ~1 nm level for a variety of different materials. Note that the non-uniformity is decreased by processing complex patterns of non-uniform thickness. Conversely, in accordance with the embodiments of the disclosure, applying the same selective area etching using a reactive ion beam together with substrate scanning may be employed to deliberately increase thickness non-uniformity in a stress compensation layer. Thus, complex patterns of thickness non-uniformity may be introduced into a stress compensation layer having an initially uniform thickness across a substrate, with a thickness control at the level of ~1 nm, and a lateral control of patterning of the stress compensation layer on the order of 100 μm to one centimeter.

To explain further the operations related to a chained implant procedure and use of SRR information for processing a stress compensation layer (SCL), FIG. 1A shows further details of the controller 50. In this embodiment, the controller 50 may include a processor 52, such as a known type of microprocessor, dedicated processor chip, general purpose processor chip, or similar device. The controller 50 may further include a memory or memory unit 54, coupled to the processor 52, where the memory unit 54 contains a selective area stress management (SASM) routine 56. With reference also to FIG. 1A, the SASM routine 56 may be operative on the processor 52 to manage a selective area processing using the ion beam 138 and substrate 110 in order form a patterned stress compensation layer, according to the approaches as discussed above. The memory unit 54 may comprise an article of manufacture. In one embodiment, the memory unit 54 may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

In some implementations, the memory unit 54 may receive and/or store stress information related to the substrate/stress compensation layer, as discussed above, for a given wafer or set of wafers. In some implementations, the memory unit 54 may store OPD information such as a substrate surface maps for substrate measured before selective area processing is performed. The memory unit 54 may include other information such as beam shape for an ion beam to perform the selective area processing; measured etch rate for a reactive ion beam etching process to selectively etch a stress compensation layer; initial thickness of a stress compensation layer; measured deposition rate for a reactive ion beam deposition process to selective deposit a stress compensation layer; and so forth. These inputs may vary for given combinations of ion type/ion energy/ion dose/stress compensation layer/substrate, and so forth. This information may be used by the SASM routine 56 to generate an SAP recipe to perform a targeted selective area processing on a substrate in order form a patterned stress compensation layer to reduce an existing OPD on a substrate to be processed. The SASM routine 56 may be further operative to control the relevant components of system 100 to implement the calculated SAP recipe.

Figure 6:
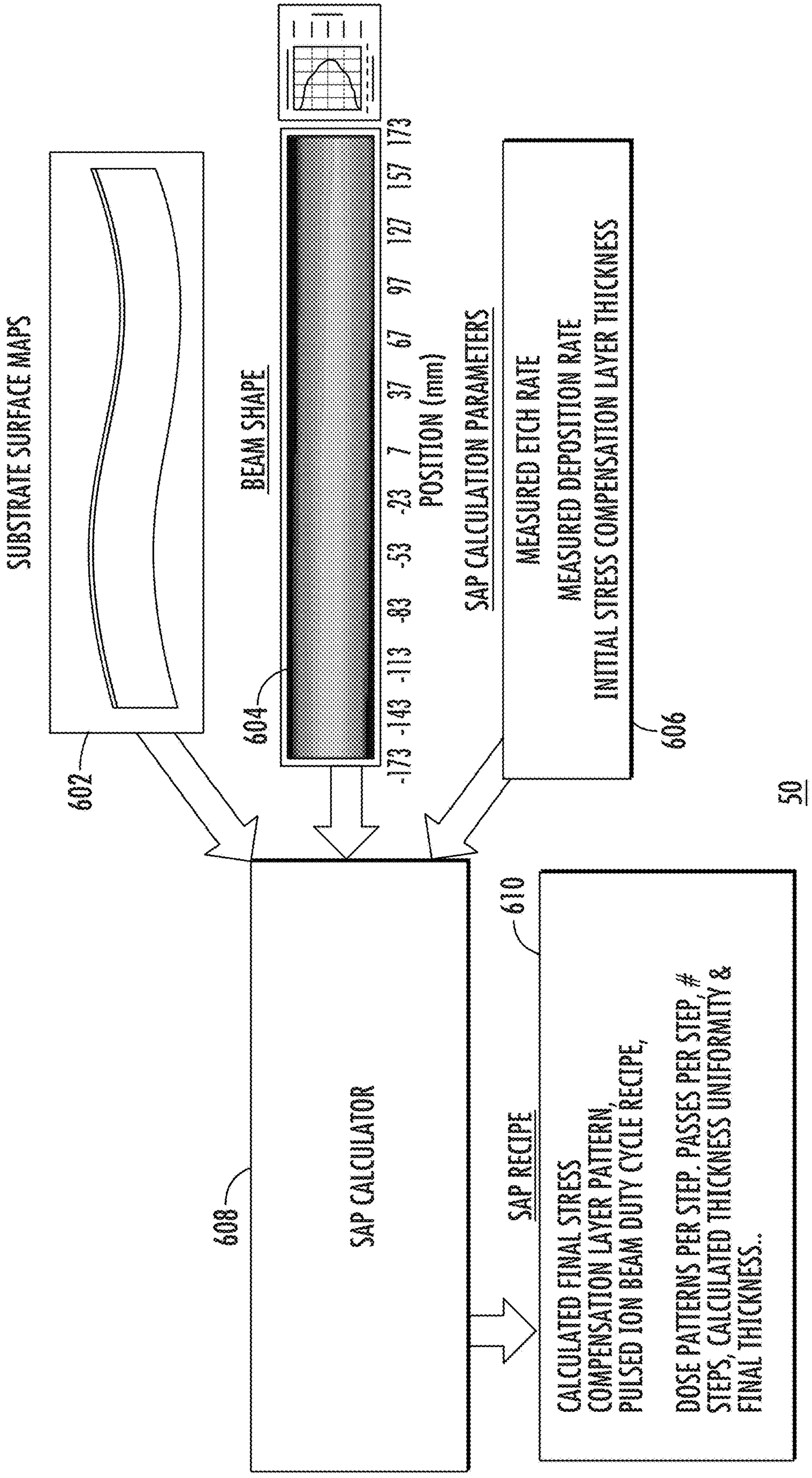
FIG. 6 depicts one scenario of operation a the controller for implementing a stress compensation procedure, in accordance with embodiments of the disclosure.

FIG. 6 depicts one scenario of operation of the controller 50 for implementing a stress compensation procedure, in accordance with embodiments of the disclosure. In this example, the SASM routine 56 may include an SAP calculator 608 that receives various inputs related to a substrate to be processed by an ion beam in order to manage the substrate stress and thus reduce OPD. The SAP calculator 608 may receive an appropriate substrate surface map for a substrate to be processed. As an example, the substrate surface map may be received from a memory unit 54 that may store a plurality of substrate surface maps 602. Such surface maps may be measured during substrate processing and may be prestored in memory unit 54. The SAP calculator 608 may receive further information, such as a measured ion beam shape 604, for an ion beam to perform a selective area processing operation, such as selective area etching, or selective area deposition, as detailed above. In addition, the SAP calculator 608 may receive a set of parameters, shown as SAP calculation parameters 606, including a measured etch rate for a reactive etching ion beam/stress compensation layer system, a measured deposition rate for a reactive deposition ion beam, a measured initial thickness of a stress compensation layer in the case of a selective area etching process, and so forth. As an example, a suitable (but non-limiting) thickness range for a stress compensation layer composed of SiN is 500 nm to 1500 nm. Suitable etch rates or deposition rates for stress compensation layers may range from 2 nm per pass to 20 nm pass in some non-limiting embodiments. For example, an etch rate or deposition rate for a stress compensation layer of 10 nm per pass will enable a wafer processing throughput of approximately 50 wafers per hour.

Based upon inputs including one or more of the substrate surface map, ion beam shape, and SAP calculation parameters, the SAP calculator 608 may then determine a set of process parameters to implement a selective area processing operation, shown as SAP recipe 610. Non-limiting examples of suitable components of an SAP recipe 610 include a calculated final stress compensation layer pattern (see patterned stress compensation layer 202A of FIG. 2C), a pulsed ion beam duty cycle recipe (See FIG. 3E), an ion dose per step, a number of passes per step, a total number of steps, as well as a calculated stress compensation layer pattern. Note that in this regard, a 'step' may refer to a set of operations that are performed by a processing beam such as an ion beam when a wafer is oriented at a particular twist angle (meaning a reference angle with respect to the X-Z plane). Thus, in a given step, the substrate (wafer) may be oriented at 0 degrees twist angle, while the substrate is scanned back and forth under a stationary ion beam, for a given number of passes. As an example, a SAP recipe 610 may include a first step at 0 degree twist angle with four passes of the substrate under the ion beam while a second step at 90 degrees twist angle includes six passes of the ion beam under the substrate; and so forth.

As such, the controller 50 may control components of the system 100 to implement the SAP recipe 610 for a given substrate, based upon the initial pattern of OPD on the substrate.

Figure 7:
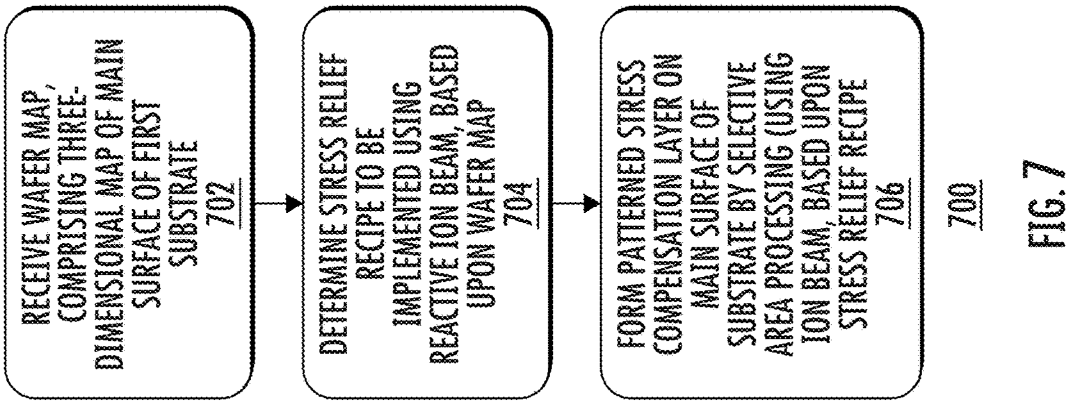
FIG. 7 depicts an exemplary process flow.

FIG. 7 presents a process flow 700, in accordance with embodiments of the disclosure. At block 702, a wafer map is received. The wafer map may represent a three dimensional map or graph, or table, presenting a three dimensional mapping of a main surface of a first substrate. The wafer map may be an experimentally measured wafer map of a substrate at a given stage of processing. As such, the wafer map may present a pattern of OPD for that substrate at the given stage of processing.

At block 704, a stress relief recipe is determined based upon the wafer map. The stress relief recipe may be implemented as a selective area processing recipe using a reactive ion beam.

At block 706, a patterned stress compensation layer is formed on the main surface of a substrate based upon the stress relief recipe. The patterned stress compensation layer may be formed by selective patterning using a processing beam that selectively etches a pre-existing stress compensation layer or alternatively, selectively deposits the stress compensation layer. In some non-limiting variants the processing beam may represent a plurality of processing beams, such as ion beams, radical beams, or a combination thereof, such as from a system as generally depicted in FIGS. 1A-1C.

The pre-existing stress compensation layer may be dedicated layer that is deposited on the substrate before block 706 or may be a pre-existing layer than is formed on the substrate for additional purposes, such as a hardmask. In some examples, the substrate upon which the stress compensation layer is formed may be the first substrate that was used to generate the wafer map. In other examples, the substrate upon which the stress compensation layer is formed may be a different substrate than the first substrate, such as a substrate that was processed similarly to the first substrate. Thus, a stress relief recipe derived from a wafer map of a given substrate may be used to process a plurality of substrates in some embodiments.

Figure 8:
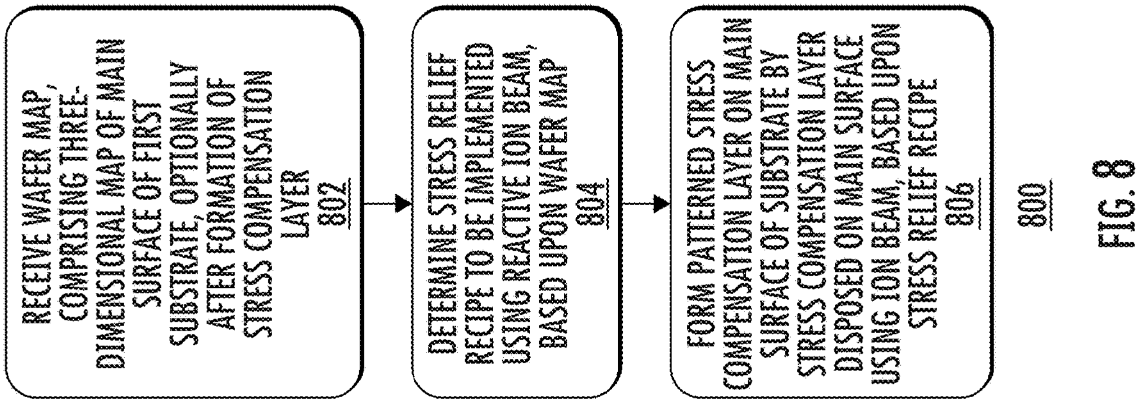
FIG. 8 depicts a further exemplary process flow.

FIG. 8 presents another process flow 800, in accordance with embodiments of the disclosure. At block 802, a wafer map is received. The wafer map may represent a three dimensional map or graph, or table, presenting a three dimensional mapping of a main surface of a first substrate. The wafer map may be an experimentally measured wafer map of a substrate at a given stage of processing. For example, the substrate may include a stress compensation layer that is deposited on an outer surface of the substrate. As such, the wafer map may present a pattern of OPD for that substrate at the given stage of processing.

At block 804, a stress relief recipe is determined based upon the wafer map. The stress relief recipe may be implemented as a selective area processing recipe using a reactive ion beam.

At block 806, a patterned stress compensation layer is formed on the main surface of a substrate based upon the stress relief recipe. The patterned stress compensation layer may be formed by selective area etching of a pre-existing stress compensation layer that is deposited before the wafer map is determined, or alternatively is deposited after the wafer map is determined. In some non-limiting variants the selective area etching is accomplished by using a single processing beam or a plurality of processing beams, such as ion beams, radical beams, or a combination thereof such as from a system as generally depicted in FIGS. 1A-1C.

In some examples, the substrate upon which the stress compensation layer is formed may be the first substrate that was used to generate the wafer map. In other examples, the substrate upon which the stress compensation layer is formed may be a different substrate than the first substrate, such as a substrate that was processed similarly to the first substrate. Thus, a stress relief recipe derived from a wafer map of a given substrate may be used to process a plurality of substrates in some embodiments.

Figure 9:
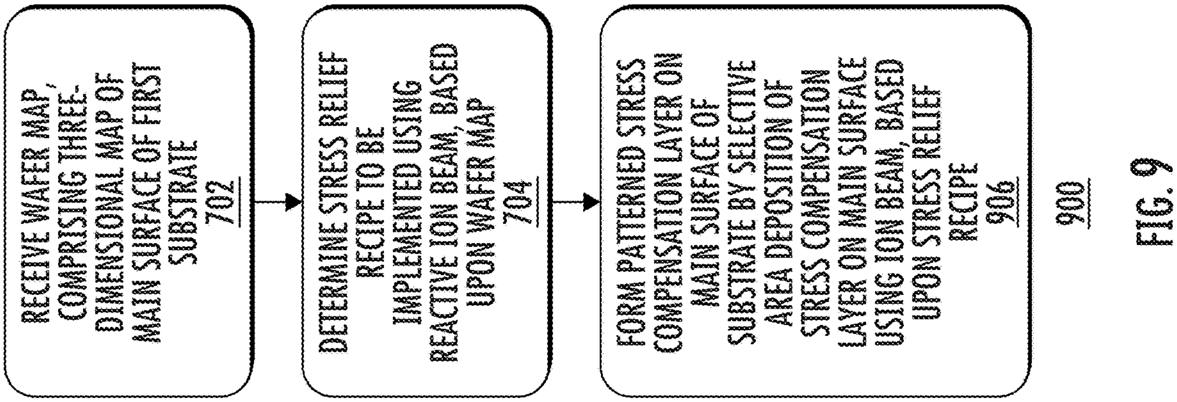
FIG. 9 depicts another exemplary process flow.

FIG. 9 presents a further example of a process flow, process flow 900, in accordance with embodiments of the disclosure. The process flow 900 may commence with block 702 and block 704, described above.

At block 906, a patterned stress compensation layer is formed on the main surface of a substrate based upon the stress relief recipe. The patterned stress compensation layer may be formed by selective area deposition of a stress compensation layer that is deposited to manage OPD based upon the stress relief recipe. In some non-limiting variants the selective area deposition is accomplished by using a single processing beam or a plurality of processing beams, such as ion beams, radical beams, or a combination thereof, such as from a system as generally depicted in FIGS. 1A-1C.

In some examples, the substrate upon which the stress compensation layer is formed may be the first substrate that was used to generate the wafer map. In other examples, the substrate upon which the stress compensation layer is formed may be a different substrate than the first substrate, such as a substrate that was processed similarly to the first substrate. Thus, a stress relief recipe derived from a wafer map of a given substrate may be used to process a plurality of substrates in some embodiments.

Figure 10:
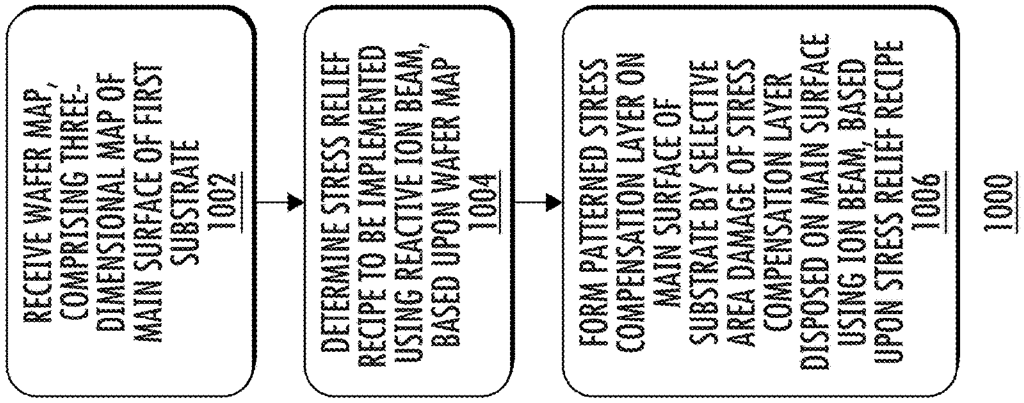
FIG. 10 depicts an additional exemplary process flow.

FIG. 10 presents a further example of a process flow, process flow 1000, in accordance with embodiments of the disclosure. The process flow 1000 may commence with block 802 and block 804, described above.

At block 1006, a patterned stress compensation layer is formed on the main surface of a substrate based upon the stress relief recipe. The patterned stress compensation layer may be formed by selective area damage of a pre-existing stress compensation layer that is deposited to manage OPD based upon the stress relief recipe. In some examples, the substrate upon which the stress compensation layer is formed may be the first substrate that was used to generate the wafer map. In other examples, the substrate upon which the stress compensation layer is formed may be a different substrate than the first substrate, such as a substrate that was processed similarly to the first substrate. Thus, a stress relief recipe derived from a wafer map of a given substrate may be used to process a plurality of substrates in some embodiments. In some examples the selective area damage may be performed by an inert ion beam or inert neutral beam, where the energy of the inert beam is determined so as to selectively damage the stress compensation layer to locally change the stress in the stress compensation layer as a function of position on the substrate. In some examples, the ion energy of an ion beam may be such that the stress compensation layer is not substantially etched as a result of the selective area damage. In some non-limiting embodiments, the selective area damage may be accomplished using a plurality of inert ion beams or inert neutral beams, such as from a system as generally depicted in FIGS. 1A-1C.

Advantages provided by the present embodiments are multifold. As a first advantage, substrate stress management using a compact ion beam to selectively pattern a stress compensation layer provides a potentially more rapid substrate throughput than known ion implantation techniques used for stress control. As another advantage, selective patterning of a stress compensation layer using a ribbon beam provides potentially more accurate control of two dimensional patterns of OPD in a substrate surface. A further advantage provided by embodiments of the disclosure is the ability to "Direct write" a patterned Stress Compensation Layer, instead of approaches that may employ a uniform deposition of a stressed layer, followed by processing to de-stress certain areas The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of stress management in a substrate, comprising:
- providing a substrate having a main surface; and
- forming a patterned stress compensation layer on the main surface,
- wherein the patterned stress compensation layer is formed by exposing the main surface to a processing beam while a movement of the processing beam with respect to the main surface takes place, wherein the forming the patterned stress compensation layer comprises:
- providing the stress compensation layer as an uncovered stress compensation layer; and
- performing a selective area etching operation, wherein the uncovered stress compensation layer is selectively etched as a function of position across the main surface by exposing the uncovered stress compensation layer to the processing beam ion beam during the movement.

2. The method of claim 1, wherein the performing the selective area etching operation comprises varying a duty cycle of an ion beam while scanning the main surface with respect to the ion beam.

3. The method of claim 1, wherein the processing beam is a ribbon beam, wherein the performing the selective area etching operation comprises varying a scan speed of the substrate as a function of position of the processing beam on the main surface.

4. A method of stress management in a substrate, comprising:
- providing a substrate having a main surface; and
- forming a patterned stress compensation layer on the main surface,
- wherein the forming the patterned stress compensation layer comprises:
- depositing the stress compensation layer by condensing a species derived from a pulsed ion beam, wherein a duty cycle of the pulsed ion beam is varied as a function of position, while movement of the pulsed ion beam with respect to the main surface takes place, and
- the stress compensation layer has a non-uniform thickness as a function of position across the main surface.

5. The method of claim 1, wherein the processing beam comprises a ribbon ion beam, wherein the substrate is scanned along a scan direction while the ribbon ion beam remains stationary.

6. The method of claim 1, wherein the patterned stress compensation layer is determined based upon a surface map of the main surface of the substrate.

7. A method of stress management in a substrate, comprising:
- providing a substrate having a main surface; and
- forming a patterned stress compensation layer on the main surface,
- wherein the patterned stress compensation layer is formed by exposing the main surface to a processing beam while a movement of the processing beam with respect to the main surface takes place, wherein the forming the patterned stress compensation layer comprises:
- providing a substrate having a stress compensation layer on the main surface; and
- performing a selective area damage operation, wherein the stress compensation layer is selectively damaged as a function of position across the main surface by scanning the processing beam in a non-uniform manner, and wherein the selective area damage causes at least one of: a reduction in crystalline order, and an amorphization of the stress compensation layer.

8. A method of stress management in a substrate, comprising:
- providing a substrate having a main surface; and
- forming a patterned stress compensation layer on the main surface,
- wherein the forming the patterned stress compensation layer comprises:
- depositing the stress compensation layer by condensing a species derived from an ion beam,
- wherein a relative scan rate of the ion beam with respect to the substrate is varied as a function of position, while movement of the ion beam with respect to the main surface takes place, and
- wherein the stress compensation layer has a non-uniform thickness as a function of position across the main surface.

* * * * *